United States Patent
Kang

(10) Patent No.: US 6,960,527 B2
(45) Date of Patent: Nov. 1, 2005

(54) METHOD FOR FABRICATING NON-VOLATILE MEMORY DEVICE HAVING SIDEWALL GATE STRUCTURE AND SONOS CELL STRUCTURE

(75) Inventor: Sung-Taeg Kang, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 185 days.

(21) Appl. No.: 10/655,308

(22) Filed: Sep. 5, 2003

(65) Prior Publication Data

US 2004/0048481 A1 Mar. 11, 2004

(30) Foreign Application Priority Data

Sep. 11, 2002 (KR) .............................. 10-2002-0055002

(51) Int. Cl.[7] ............................................ H01L 21/302
(52) U.S. Cl. ..................... 438/694; 438/696; 438/706; 438/719; 438/723; 438/724
(58) Field of Search ................................ 438/694, 696, 438/706, 719, 723, 724

(56) References Cited

U.S. PATENT DOCUMENTS

| | | | | |
|---|---|---|---|---|
| 5,559,735 A | * | 9/1996 | Ono et al. ................ | 365/185.3 |
| 5,780,893 A | * | 7/1998 | Sugaya ........................ | 257/318 |
| 6,172,397 B1 | * | 1/2001 | Oonakado et al. .......... | 257/321 |
| 6,657,893 B2 | * | 12/2003 | Takahashi et al. ...... | 365/185.15 |
| 6,747,310 B2 | * | 6/2004 | Fan et al. .................... | 257/320 |

* cited by examiner

Primary Examiner—Nadine G. Norton
Assistant Examiner—Binh X. Tran
(74) Attorney, Agent, or Firm—Volentine Francos & Whitt, PLLC

(57) ABSTRACT

First and second vertical structures are formed on first and second surface regions of a silicon substrate. Each of the first and second vertical structures includes a tunneling layer pattern, a charge trapping layer pattern, and blocking layer pattern sequentially stacked on the silicon substrate. A gate insulating layer is formed on a third surface region of the silicon substrate which is interposed between the first and second surface regions of the silicon substrate. First and second gate spacers are formed on respective surface portions of the gate insulating layer, with the first gate spacer contacting an upper portion of a sidewall of the first vertical structure and protruding above an upper surface of the first vertical structure, and the second gate spacer contacting an upper portion of a sidewall of the second vertical structure and protruding above an upper surface of the second vertical structure. A gate forming conductive layer is formed on exposed surfaces of the first and second vertical structures, the first and second gate spacers, and the gate insulating layer, and the gate forming conductive layer is then etched to form first and second gate electrodes, where the first and second gate electrodes expose portions of the first and second vertical structures and the gate insulating layer. Portions of the first and second vertical structures and the gate insulating layer exposed by the first and second gate electrodes are removed by performing an etching process using the first and second gate electrodes as an etch mask. A source region and a drain region are then formed by implanting impurity ions in portions of the silicon substrate exposed by the first and second gate electrodes.

14 Claims, 4 Drawing Sheets

METHOD FOR FABRICATING NON-VOLATILE MEMORY DEVICE HAVING SIDEWALL GATE STRUCTURE AND SONOS CELL STRUCTURE

BACKGROUND OF THE INVENTION

1. Field of the Invention

The present invention relates to a method for fabricating a non-volatile memory device, and more particularly, the present invention relates to a method for fabricating a non-volatile memory cell having a sidewall gate structure and a siliconoxide-nitride-oxide-silicon (SONOS) cell structure.

A claim of priority is made to Korean Patent Application No. 2002-55002, filed Sep. 11, 2002 in the Korean Intellectual Property Office, which is incorporated herein in its entirety by reference.

2. Description of the Related Art

Semiconductor memory devices used to store data are generally classified as volatile memory devices or non-volatile memory devices. Volatile memory devices lose stored data when the supply of power is stopped, whereas non-volatile memory devices retain stored data even in the absence of power. Accordingly, non-volatile memory devices are widely used when power cannot be continuously supplied or low level power must be used, as in the cases of portable telephone systems, memory cards for storing music and/or image data, and other appliances.

Cell transistors used in non-volatile memory devices typically have a stacked gate structure. The stacked gate structure includes a gate insulating layer, a floating gate electrode, an insulating layer between gates, and a control gate electrode, which are sequentially stacked on a channel region of the cell transistor. In some cases, the non-volatile memory device is formed of a structure which includes a silicon layer having a channel region, an oxide layer forming a tunneling layer, a nitride layer used as a charge trapping layer, an oxide layer used as a blocking layer, and a silicon layer used as a control gate electrode. Such a structure is referred to as a silicon-oxide-nitride-oxide-silicon (SONOS) cell structure.

FIG. 1 is a sectional view illustrating a non-volatile memory device having a conventional SONOS cell structure.

Referring to FIG. 1, an oxide-nitride-oxide (ONO) layer 110 is formed on a silicon substrate 102 having a source region 104 and a drain region 106 which are separated from one another by a given distance. Here, the ONO layer 110 is formed by sequentially stacking a first silicon oxide layer 112 as a tunneling layer, a silicon nitride layer 114 as a charge trapping layer, and a second silicon oxide layer 116 as a blocking layer. A polysilicon layer 120 used as a control gate electrode is formed on the ONO layer 110.

In order to write data in the non-volatile memory device or program the non-volatile memory device, positive bias voltages are applied to the control gate electrode 120 and the drain region 106, and the source region 104 is grounded. The voltages applied to the control gate electrode 120 and the drain region 106 generate vertical and horizontal electric fields along the length of the channel region, which extends from the source region 104 to the drain region 106. The electric fields cause electrons to accelerate from the source region 104 to the drain region 106, and the electrons obtain energy while moving along the length of the channel region. Some of the electrons enter into a "hot" state and travel into the charge trapping layer 114 over the potential barrier of the tunneling layer 112. Since the electrons obtain the largest amount of energy at the channel region in the vicinity of the drain region 106, the possibility of the electrons entering a "hot" state is the largest at the channel region in the vicinity of the drain region 106. When hot electrons enter into the charge trapping layer 114 which is formed of an insulating material, the hot electrons are trapped and stored in the charge trapping layer 114, so the threshold voltage of the memory cell is increased.

In order to erase the non-volatile memory device, voltages are used which are different from the voltages used in programming or reading data from the memory cell. For example, a positive bias voltage is applied to the drain region 106 and a negative bias voltage is applied to the control gate electrode 120. In addition, the source region 104 is floated. Accordingly, the electrons stored in the silicon nitride layer 114 move toward the drain region 106, or holes of the drain region 106 are injected into the silicon nitride layer 114. As a result, the electrons are removed from the silicon nitride layer 114, or the silicon nitride layer 114 is neutralized by the injected holes, so the memory cell is erased.

Recently, a sidewall gate structure has been developed which relies on the phenomenon in which hot electrons are trapped in the portion of the silicon nitride layer 114 around the drain region 106. Here, in the sidewall gate structure, the ONO layer 110 is formed on the portion adjacent to the drain region 106, so the polysilicon layer used as the control gate electrode covers the sidewall of the ONO layer 110.

FIG. 2 is a sectional view illustrating a non-volatile memory device having a sidewall gate structure and a SONOS cell structure. The same reference numerals as those of FIG. 1 denote the same regions or layers, and the descriptions of such elements will not be repeated.

Referring to FIG. 2, an ONO layer 210 is formed by sequentially stacking a first silicon oxide layer 212, a silicon nitride layer 214, and a second silicon oxide layer 214 on a portion of a silicon substrate 102 near a drain region 106. In addition, a third silicon oxide layer 230 is formed as a gate insulating layer on a portion of the silicon substrate 1.02 on which the ONO layer 210 is not formed. A polysilicon layer 220 is formed as a control gate electrode on the ONO layer 210 and the third silicon oxide layer 230. Since the thickness of the ONO layer 210 is larger than the thickness of the third silicon oxide layer 230, the polysilicon layer 220 contacts the portion of the sidewall of the ONO layer 210, and accordingly, the polysilicon layer 220 is referred to as a sidewall gate.

Certain advantages are realized by the non-volatile memory device having a sidewall gate structure and a SONOS cell structure. For example, the electrical characteristics of the device can be improved by adjusting the thickness of the third silicon oxide layer 230. Also, the integration of the device can be improved by forming the ONO layer 210 on the portion of the silicon substrate 102 adjacent to the drain region 106.

However, the fabrication processes of the non-volatile memory device having the sidewall gate structure and the SONOS cell structure must be performed within the limits of photolithography parameters. In particular, a photolithography process is used when forming an etch mask after the ONO layer 210 is stacked. In this case, if the integration degree of the device is substantially increased, a misalignment may occur due to the limits of the photolithography process. As such, there are limits to the degree of integration of the fabricated device.

SUMMARY OF THE INVENTION

The present invention provides a method for fabricating a highly integrated non-volatile memory device having a sidewall gate structure and a silicon-oxide-nitride-oxide-silicon (SONOS) cell structure.

According to an aspect of the present invention, there is provided a method for fabricating a non-volatile memory device. First and second vertical structures are formed on first and second surface regions of a silicon substrate. Each of the first and second vertical structures includes a tunneling layer pattern, a charge trapping layer pattern, and blocking layer pattern sequentially stacked on the silicon substrate. A gate insulating layer is formed on a third surface region of the silicon substrate which is interposed between the first and second surface regions of the silicon substrate. First and second gate spacers are formed on respective surface portions of the gate insulating layer, with the first gate spacer contacting an upper portion of a sidewall of the first vertical structure and protruding above an upper surface of the first vertical structure, and the second gate spacer contacting an upper portion of a sidewall of the second vertical structure and protruding above an upper surface of the second vertical structure. A gate forming conductive layer is formed on exposed surfaces of the first and second vertical structures, the first and second gate spacers, and the gate insulating layer, and the gate forming conductive layer is then etched to form first and second gate electrodes, where the first and second gate electrodes expose portions of the first and second vertical structures and the gate insulating layer. Portions of the first and second vertical structures and the gate insulating layer exposed by the first and second gate electrodes are removed by performing an etching process using the first and second gate electrodes as an etch mask. A source region and a drain region are then formed by implanting impurity ions in portions of the silicon substrate exposed by the first and second gate electrodes.

It is preferable that the formation of the vertical structures includes sequentially stacking a tunneling layer, a charge trapping layer, and a blocking layer on the silicon substrate, forming a mask layer pattern on the blocking layer which exposes a portion of the blocking layer, and then sequentially etching the blocking layer, the charge trapping layer, and the tunneling layer using the mask layer pattern as an etch mask to expose the third second surface region of the silicon substrate.

It is preferable that the tunneling layer, the charge trapping layer, and the blocking layer are a first oxide layer, a nitride layer, and a second oxide layer, respectively. The first oxide layer may be formed by thermal oxidation. The nitride layer may be formed by low pressure chemical vapor deposition (LPCVD) or by nitridation on the first oxide layer. The second oxide layer may also be formed by LPCVD.

It is preferable that the mask layer patterns are nitride layer patterns.

The charge trapping layer may be formed of a layer including polysilicon dots. The charge trapping layer may be formed of a layer including nitride dots.

It is preferable that the formation of the gate spacers includes forming a gate spacer conductive layer on the gate insulating layer, the exposed sidewall of the vertical structure, and the mask layer pattern, etching the gate spacer forming conductive layer to expose the mask layer pattern and the gate insulating layer, and removing the mask layer pattern.

It is preferable that the gate spacer forming conductive layer is a polysilicon layer.

It is preferable that the gate forming conductive layer is a polysilicon layer.

It is preferable that the etching of the gate forming conductive layer is by an etch-back process.

It is preferable that the method further includes forming a metal silicide layer on the gate forming conductive layer.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF THE INVENTION

FIGS. 3 through 9 are sectional views for explaining a method according to an embodiment of the present invention for fabricating a non-volatile memory device having a sidewall gate structure and a silicon-oxide-nitride-oxide-silicon (SONOS) cell structure. Like elements and layers are represented by like reference numbers throughout these drawings.

Figure 1:
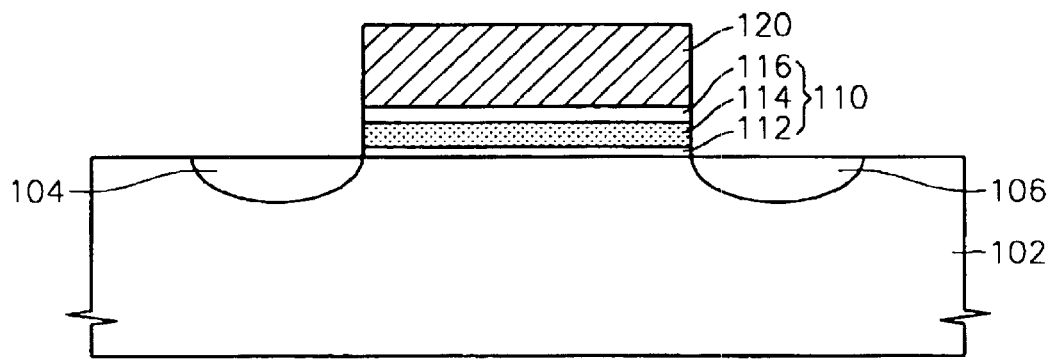
FIG. 1 is a sectional view illustrating a non-volatile memory device having a conventional silicon-oxide-nitride-oxide-silicon (SONOS) cell structure.
Figure 2:
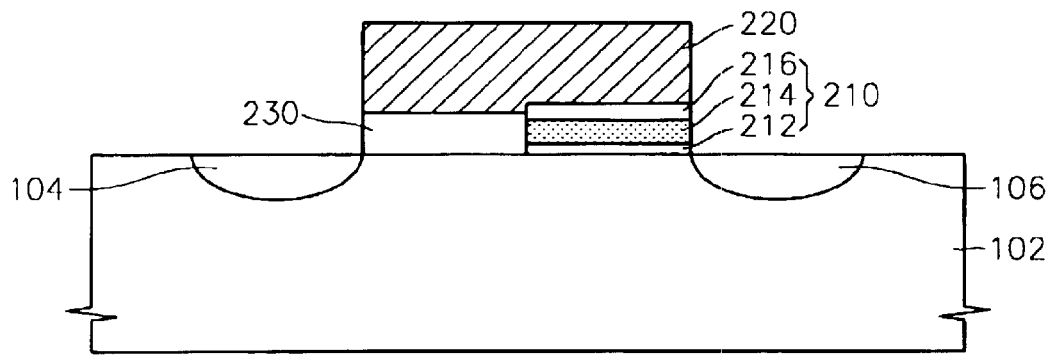
FIG. 2 is a sectional view illustrating a conventional non-volatile memory device having a sidewall gate structure and a SONOS cell structure.
Figure 3:
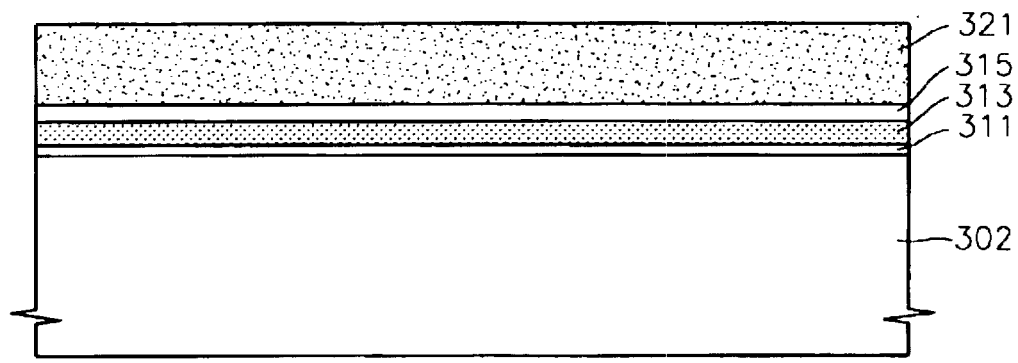
FIGS. 3 through 9 are sectional views for explaining a method according to an embodiment of the present invention for fabricating a non-volatile memory device having a sidewall gate structure and a SONOS cell structure.

Referring first to FIG. 3, a first oxide layer 311, a first nitride layer 313, a second oxide layer 315, and a second nitride layer 321 are sequentially formed on a silicon substrate 302. Here, the first oxide layer 311, which is used as a tunneling layer, is formed by a thermal oxidation method which may be performed in a $N_2O$ gas or NO gas atmosphere. The first nitride layer 313, which is used as a charge trapping layer, may be formed by a low pressure chemical vapor deposition (LPCVD) process. Alternatively, the first nitride layer 313 can be formed by performing a nitridation process on the first oxide layer 311. A layer including polysilicon dots or nitride dots can also be used as the first nitride layer 313. The second oxide layer 315, which is used as a blocking layer, may be formed by an LPCVD process. In addition, the second nitride layer 321, which is used as an etch mask in a subsequent process, may be formed by an LPCVD process.

Figure 4:
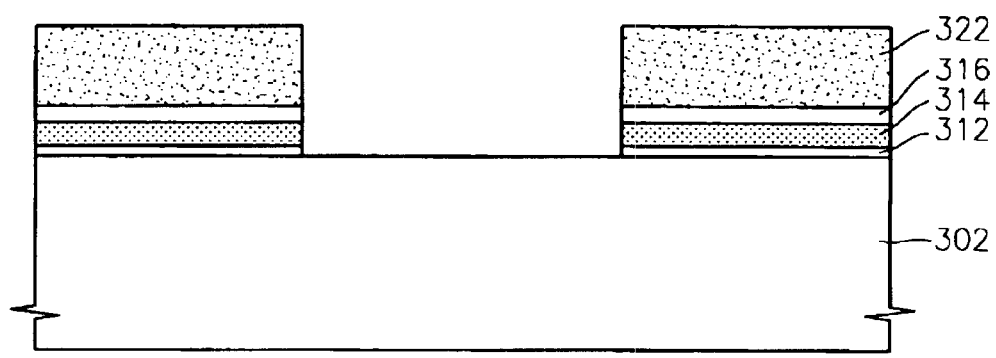

Referring to FIG. 4, a photoresist layer pattern (not shown) is formed on the second nitride layer 321. Here, the photoresist layer pattern has openings exposing portions of the second nitride layer 321 (FIG. 3). Thereafter, the second nitride layer 321 is etched using the photoresist layer pattern as an etch mask, to form second nitride layer patterns 322. Here, the second nitride layer 321 may be etched by dry etching. The second nitride layer patterns 322 have openings exposing portions of the second oxide layer 315 (FIG. 3). The photoresist layer pattern is removed, and an etching process is performed to expose the silicon substrate 302 using the second nitride layer patterns 322 as an etch mask. In this manner, second oxide layer patterns 316, first nitride layer patterns 314, and first oxide layer patterns 312 are sequentially formed, with a portion of the silicon substrate 302 being exposed. In this example, etching to form the layer patterns 316, 314, and 312 is carried out by dry etching only. However, both wet etching and dry etching can be conducted so as to avoid damage to the silicon substrate 302.

After the portion of the silicon substrate 302 is exposed, an ion implantation process for adjusting a threshold voltage is performed.

Figure 5:
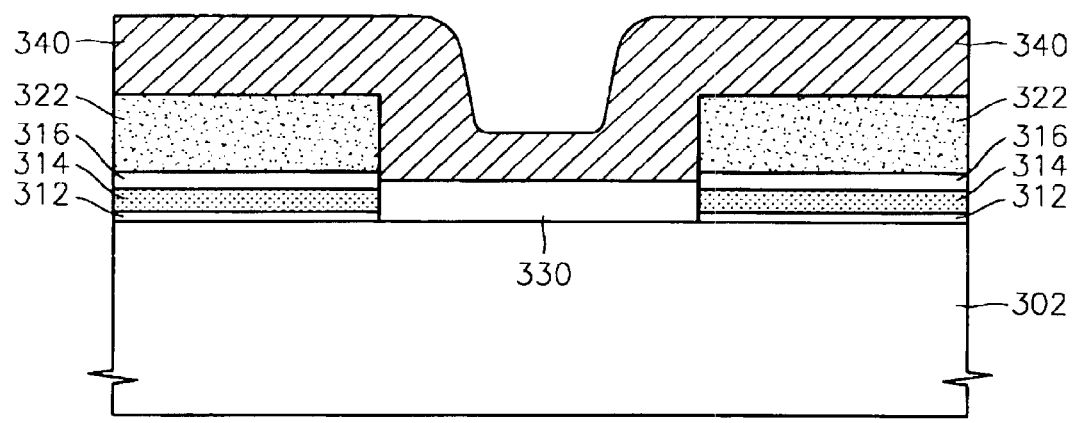

Referring next to FIG. 5, a third oxide layer 330 is formed on the exposed surface of the silicon substrate 302, and thereafter, a conductive polysilicon layer 340 is formed on the resultant structure. The third oxide layer 330, which is used as a gate insulating layer, may be formed by a middle temperature oxidation (MTO) process. Also, the upper surface of the third oxide layer 330 is formed to be higher than the upper surface of the first nitride layer patterns 314. In this manner, there is no electrical contact between the polysilicon layer 340 and the first nitride layer patterns 314.

Figure 6:
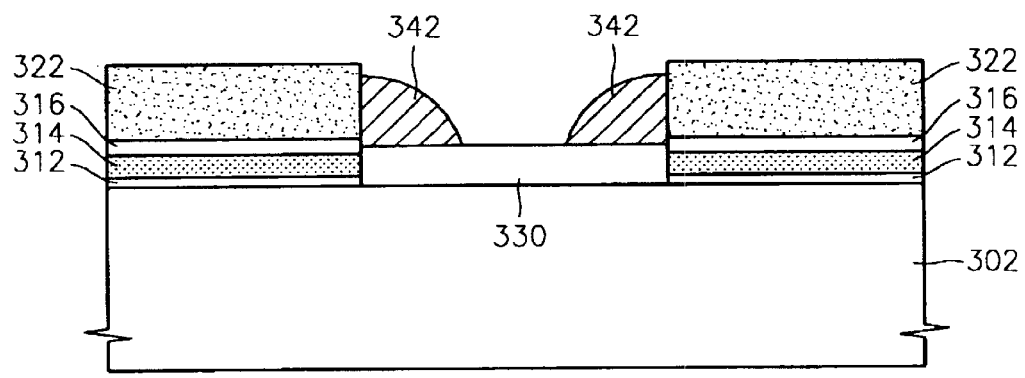

Referring to FIG. 6, the polysilicon layer 340 is etched so that the polysilicon layer 340 is removed from the upper surfaces of the second nitride layer patterns 322 and a portion of the upper surface of the third oxide layer 330. Accordingly, polysilicon layer spacers 342 are formed as gate spacers on the sidewalls of the second oxide layer patterns 316 and the second nitride layer patterns 322 and on portions of the third oxide layer 330. Here, the polysilicon layer 340 can be etched by an etch-back process.

Figure 7:
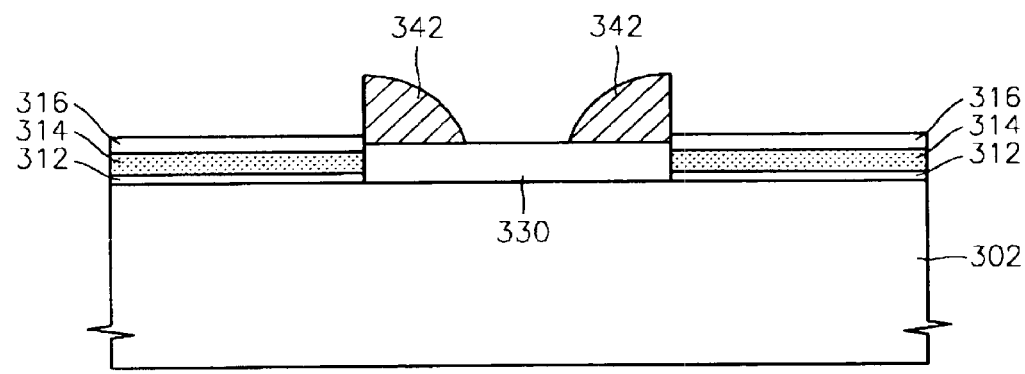

Referring to FIG. 7, the second nitride layer patterns 322 are completely removed. For example, the second nitride layer patterns 322 may be removed by wet etching using phosphorus acid as an etchant. When the second nitride layer patterns 322 are removed, the second oxide layer patterns 316 are exposed, and the portions of the sidewalls of the polysilicon layer spacers 342, which contacted the second nitride layer patterns 322, are exposed.

Figure 8:
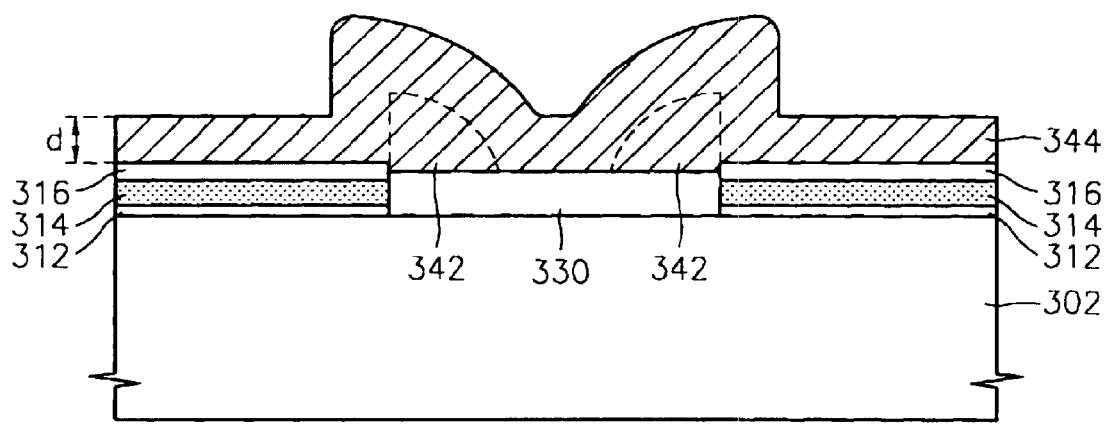

On the resultant structure, referring to FIG. 8, a polysilicon layer 344 is formed as a gate forming conductive layer. The polysilicon layer 344 covers the polysilicon layer spacers 342, the exposed surfaces of the second oxide layer patterns 316, and the third oxide layer 330. Here, the thickness "d" of the polysilicon layer 344 is determined according to the desired width of the oxidenitride-oxide (ONO) layers, as will be described later. After the polysilicon layer 344 is formed, a metal silicide layer (not shown) may be formed on the polysilicon layer 344 by performing a conventional silicide process.

Figure 9:
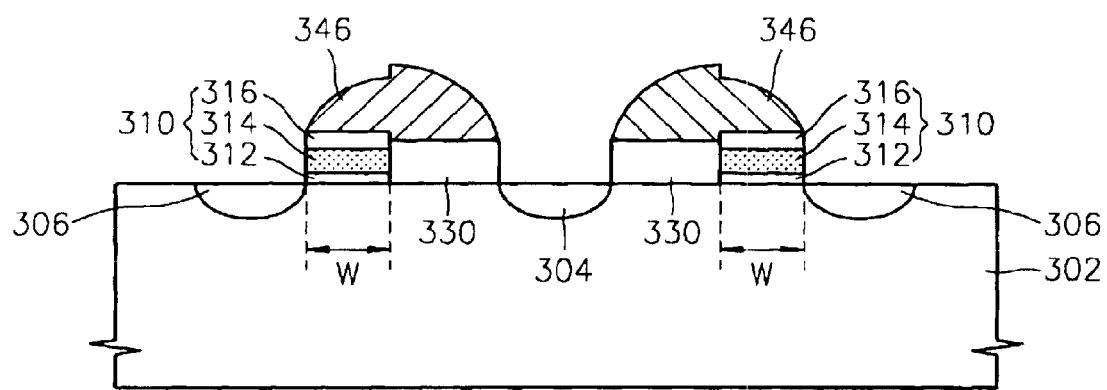

Referring to FIG. 9, the polysilicon layer 344 is etched by an etch-back process. Accordingly, polysilicon layers 346 are formed which function as control gate electrodes. When the polysilicon layer 344 is etched, portions of the second oxide layer patterns 316 and the third oxide layer pattern 330 are exposed. Remaining portions of the second oxide layer patterns 316 and the third oxide layer pattern 330 are covered by the polysilicon layers 346. Thereafter, the portions of the second oxide layer patterns 316, the first nitride layer patterns 314, the first oxide layer patterns 312, and the third oxide layer pattern 330 which are not covered by the polysilicon layers 346 are removed to expose corresponding portions of the silicon substrate 302.

As a result, ONO layers 310 having a width "W" are formed. Here, the width "W" of the ONO layers 310 is determined by the thickness "d" of the polysilicon layer 344. That is, in order to form the ONO layers 310 so as to have a large width "W", the polysilicon layer 344 should be deposited to have a small thickness "d". On the other hand, in order to form the ONO layers 310 so as to have a small width "W", the polysilicon layer 344 should be deposited to have a large thickness "d". Since the width "W" of the ONO layers 310 is determined based on the thickness "d" of the polysilicon layer 344, the fabrication processes of the non-volatile memory device are not restricted by the limits of the photolithography process.

After the polysilicon layers 346 are formed, a conventional ion implantation process is performed on the silicon substrate 302 to form a source region 304 and a drain region 306 at predetermined regions of the silicon substrate 302. Thus, a non-volatile memory device having a sidewall gate structure and a SONOS cell structure is completed. In some cases, the source region 304 and the drain region 306 can be interchanged.

As described above, the width of the ONO layers is determined by the thickness of the polysilicon layer, which is stacked in a prior process, and so the width of the ONO layers is not dependent on a photolithography process. As a result, ONO layers having a fine width can be formed, and the integration degree of the device can be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a non-volatile memory device, the method comprising:
    forming first and second vertical structures on first and second surface regions of a silicon substrate, each of the first and second vertical structures including a tunneling layer pattern, a charge trapping layer pattern, and blocking layer pattern sequentially stacked on the silicon substrate;
    forming a gate insulating layer on a third surface region of the silicon substrate which is interposed between the first and second surface regions of the silicon substrate;
    forming first and second gate spacers on respective surface portions of the gate insulating layer, the first gate spacer contacting an upper portion of a sidewall of the first vertical structure and protruding above an upper surface of the first vertical structure, and the second gate spacer contacting an upper portion of a sidewall of the second vertical structure and protruding above an upper surface of the second vertical structure;
    forming a gate forming conductive layer on exposed surfaces of the first and second vertical structures, the first and second gate spacers, and the gate insulating layer;
    etching the gate forming conductive layer to form first and second gate electrodes, wherein the first and second gate electrodes expose portions of the first and second vertical structures and the gate insulating layer;
    removing the portions of the first and second vertical structures and the gate insulating layer exposed by the first and second gate electrodes by performing an etching process using the first and second gate electrodes as an etch mask; and
    forming a source region and a drain region by implanting impurity ions in portions of the silicon substrate exposed by the first and second gate electrodes.

2. The method of claim 1, wherein the gate forming conductive layer is formed using a polysilicon layer.

3. The method of claim 1, wherein the etching of the gate forming conductive layer is an etch-back process.

4. The method of claim 1, further comprising forming a metal silicide layer on the gate forming conductive layer.

5. The method of claim 1, wherein forming the first and second vertical structures comprises:
- sequentially stacking a tunneling layer, a charge trapping layer, and a blocking layer on the silicon substrate;
- forming a mask layer pattern on the blocking layer which exposes a portion of the blocking layer; and
- sequentially etching the blocking layer, the charge trapping layer, and the tunneling layer using the mask layer pattern as an etch mask to expose the third surface region of the silicon substrate.

6. The method of claim 5, wherein the mask layer pattern is a nitride layer pattern.

7. The method of claim 5, wherein the charge trapping layer is formed of a layer including polysilicon dots.

8. The method of claim 5, wherein the charge trapping layer is formed of a layer including nitride dots.

9. The method of claim 5, wherein forming the gate spacers comprises:
- forming a gate spacer conductive layer on the gate insulating layer, the exposed sidewall of the vertical structures, and the mask layer pattern;
- etching the gate spacer forming conductive layer to expose the mask layer pattern and the gate insulating layer; and
- removing the mask layer pattern.

10. The method of claim 9, wherein the gate spacer forming conductive layer is a polysilicon layer.

11. The method of claim 5, wherein the tunneling layer, the charge trapping layer, and the blocking layer are a first oxide layer, a nitride layer, and a second oxide layer, respectively.

12. The method of claim 11, wherein the first oxide layer is formed by thermal oxidation.

13. The method of claim 11, wherein the nitride layer is formed by one of low pressure chemical vapor deposition (LPCVD) or nitridation of the first oxide layer.

14. The method of claim 11, wherein the second oxide layer is formed by low pressure chemical vapor deposition (LPCVD).

* * * * *